United States Patent [19]
Lee et al.

[11] Patent Number: 6,122,201
[45] Date of Patent: Sep. 19, 2000

[54] CLIPPED SINE WAVE CHANNEL ERASE METHOD TO REDUCE OXIDE TRAPPING CHARGE GENERATION RATE OF FLASH EEPROM

[75] Inventors: Jian-Hsing Lee, Hsin-Chu; Kuo-Reay Peng, Faung-Shan; Shui-Hung Chen; Jiaw-Ren Shih, both of Hsin-Chu, all of Taiwan

[73] Assignee: Taiwan Semiconductor Manufacturing Company, Hsin-Chu, Taiwan

[21] Appl. No.: 09/421,516

[22] Filed: Oct. 20, 1999

[51] Int. Cl.[7] .................................................. G11C 16/04
[52] U.S. Cl. .............................. 365/185.29; 365/185.19; 365/185.26; 365/185.27
[58] Field of Search ........................ 365/185.29, 185.19, 365/185.26, 185.27, 185.18

[56] References Cited

U.S. PATENT DOCUMENTS

| | | | |
|---|---|---|---|
| 5,726,933 | 3/1998 | Lee et al. | 365/185.18 |
| 5,768,192 | 6/1998 | Eitan | 365/185.24 |
| 5,828,605 | 10/1998 | Peng et al. | 365/185.29 |
| 5,838,618 | 11/1998 | Lee et al. | 365/185.29 |
| 5,862,078 | 1/1999 | Yeh et al. | 365/185.29 |

*Primary Examiner*—David Nelms
*Assistant Examiner*—Hoai V. Ho
*Attorney, Agent, or Firm*—George O. Saile; Stephen B. Ackerman; Billy Knowles

[57] ABSTRACT

A method to channel erase data from a flash EEPROM while electrical charges trapped in the tunneling oxide of a flash EEPROM are eliminated to maintain proper separation of the programmed threshold voltage and the erased threshold voltage after extended programming and erasing cycles. The method to channel erase a flash EEPROM cell begins by removing the charge from the floating gate of the flash EEPROM cell. The channel erasing consists of applying a relatively large clipped sinusoidal negative voltage pulse to the control gate of said EEPROM cell and concurrently applying a moderately large positive voltage pulse to a first diffusion region. At the same time a ground reference potential is applied to the semiconductor substrate, while the drain, the source and a second diffusion well are allowed to float.

39 Claims, 5 Drawing Sheets

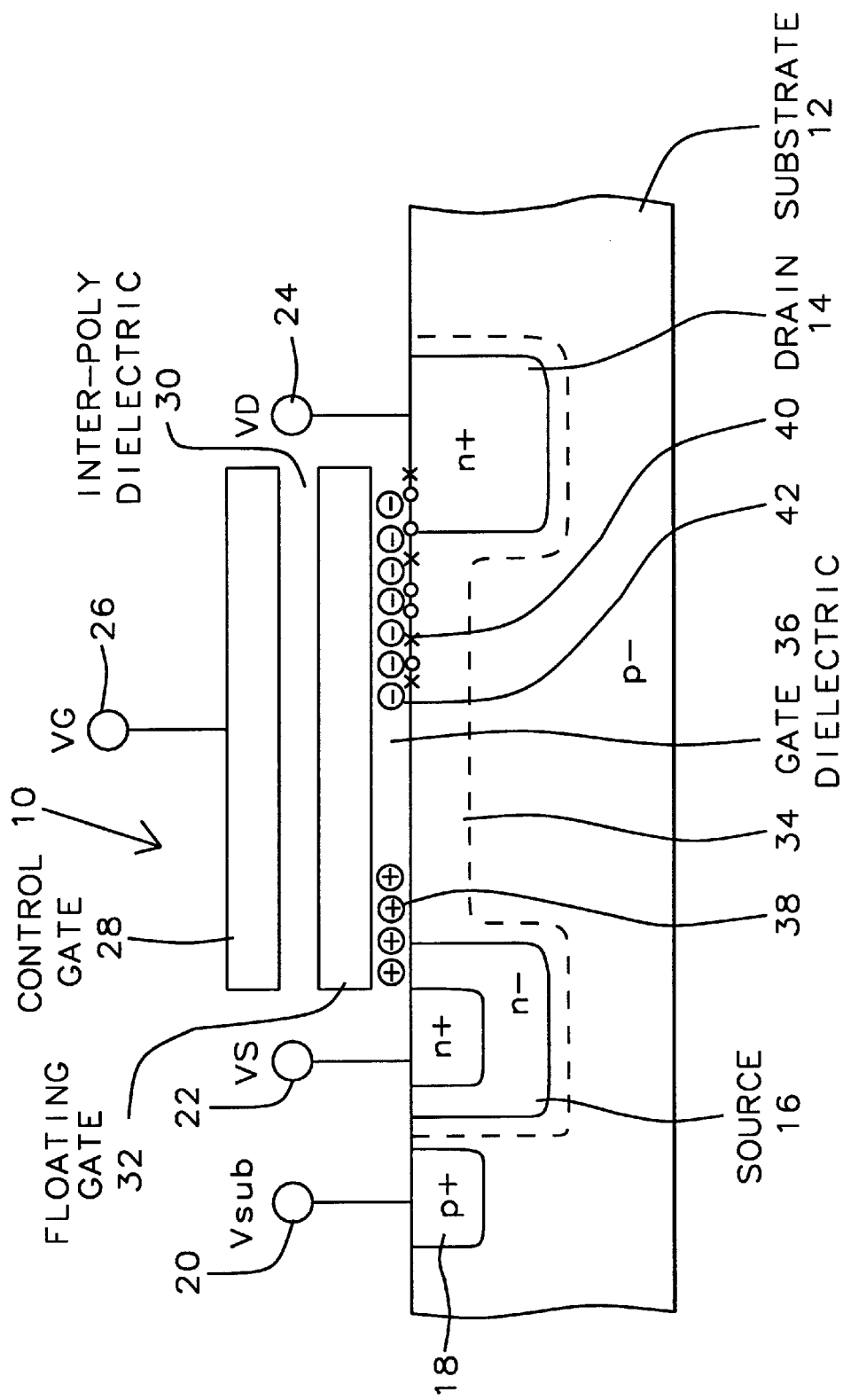
FIG. 1a – Prior Art

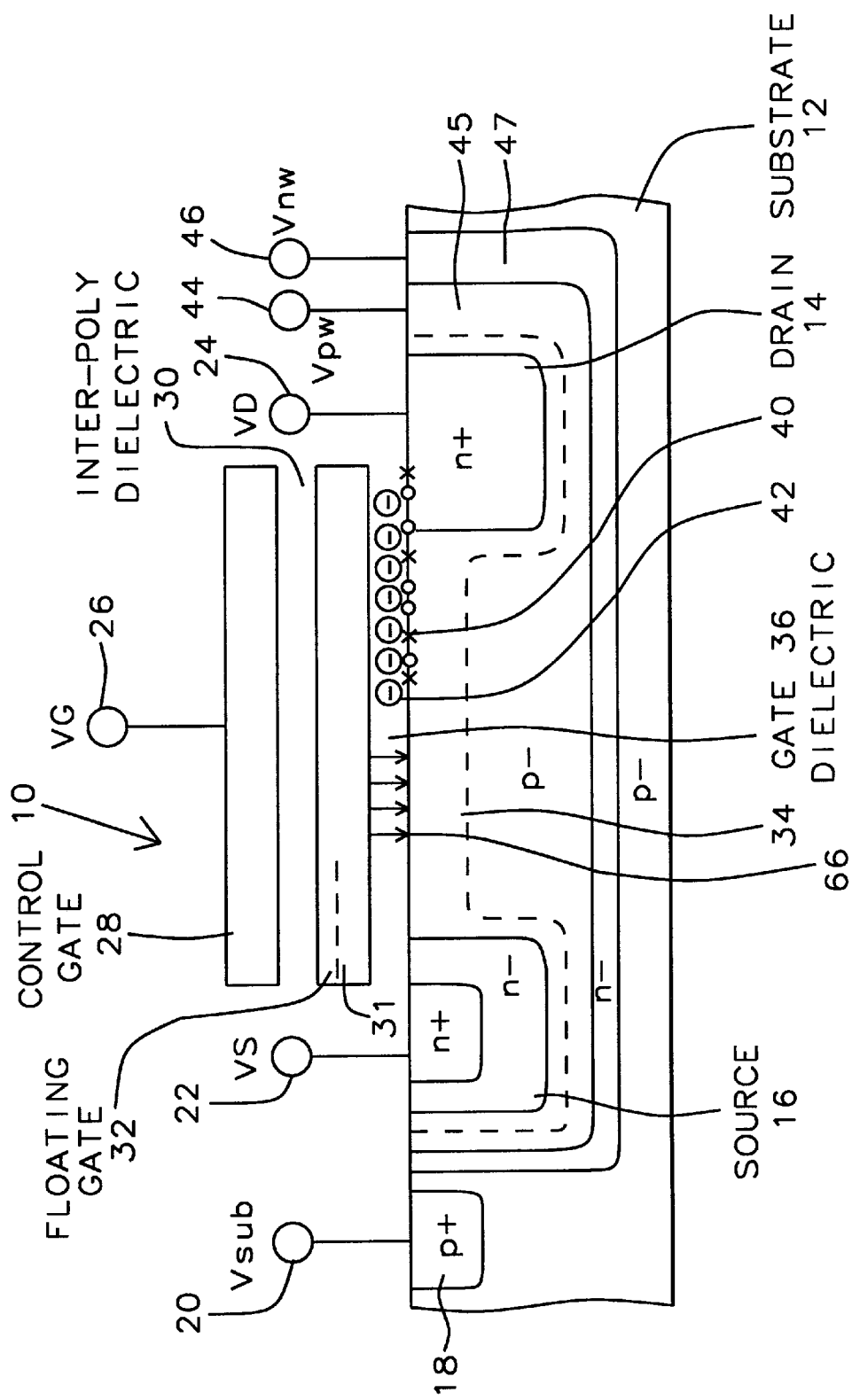
FIG. 1b – Prior Art

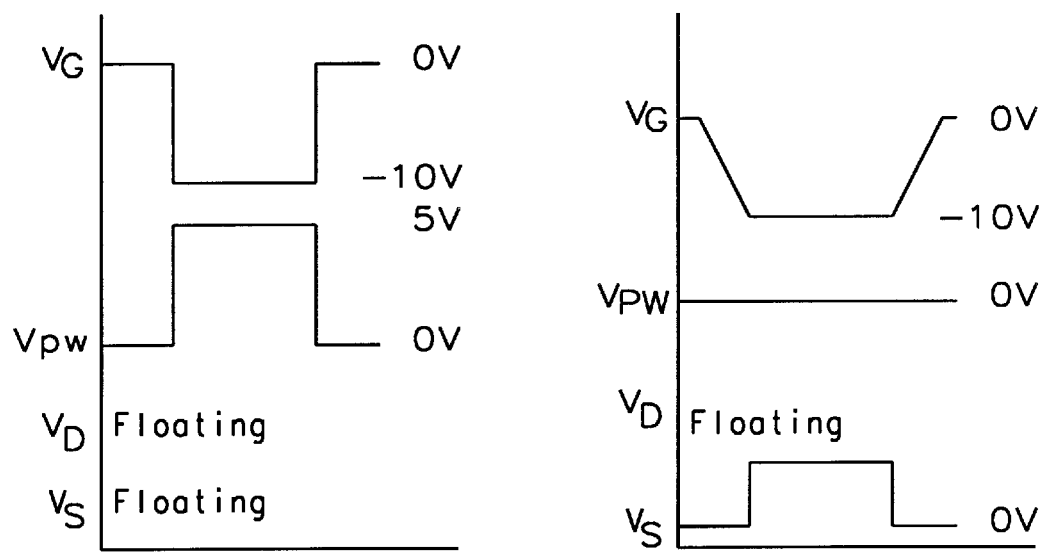
*FIG. 2a - Prior Art*
*FIG. 2b - Prior Art*
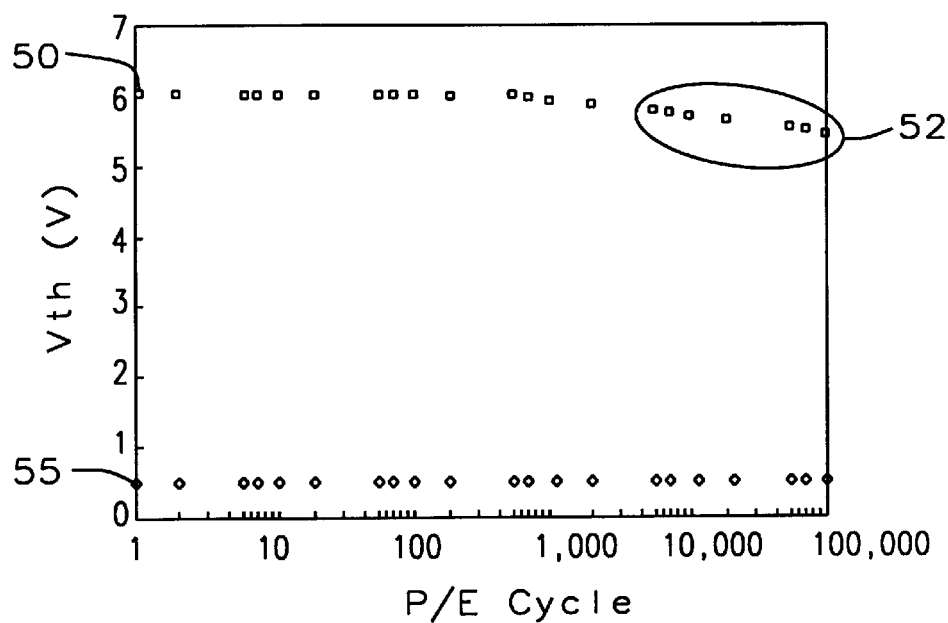
*FIG. 3 - Prior Art*

CLIPPED SINE WAVE CHANNEL ERASE METHOD TO REDUCE OXIDE TRAPPING CHARGE GENERATION RATE OF FLASH EEPROM

BACKGROUND OF THE INVENTION

1. Field of the Invention

This invention relates generally to a class of non-volatile memory devices referred to as flash electrically erasable programmable read-only memory (flash EEPROM). More particularly, this invention relates to methods and means to erase digital data from a flash EEPROM cell and for eliminating trapped charges from the flash EEPROM cell.

2. Description of Related Art

The structure and application of the flash EEPROM is well known in the art. The Flash EEPROM provides the density advantages of an erasable programmable read-only memory (EPROM) that employs ultraviolet light to eliminate the programming with the speed of a standard EEPROM. FIG. 1a illustrates a cross-sectional view of a flash EEPROM cell of the prior art. The flash EEPROM cell 10 is formed within a p-type substrate 12. An $n^+$ drain region 14 and an $n^+$ source region 16 is formed within the p-type substrate 12.

A relatively thin gate dielectric 36 is deposited on the surface of the p-type substrate 12. The thin gate dielectric 36 is also referred to as a tunneling oxide, hereinafter. A poly-crystalline silicon floating gate 32 is formed on the surface of the gate dielectric 36 above the channel region 34 between the drain region 14 and source region 16. An interpoly dielectric layer 30 is placed on the floating gate 32 to separate the floating gate 32 from a second layer of poly-crystalline silicon that forms a control gate 28.

A $p^+$ diffusion 18 is placed in the p-type substrate 12 to provide a low resistance path from a terminal 20 to the p-type substrate. The terminal 20 is attached to a substrate voltage generator Vsub. In most applications of an EEPROM, the substrate voltage generator Vsub is set to the ground reference potential (0V).

The source region 16 is connected to a source voltage generator VS through the terminal 22. The control gate 28 is connected through the terminal 26 to the control gate voltage generator VG. And the drain region 14 is connected through the terminal 24 to the drain voltage generator VD.

According to conventional operation, the flash EEPROM cell 10 is programmed by setting the gate control voltage generator VG to a relatively high voltage (on the order of 10V). The drain voltage generator VD is set to a moderately high voltage (on the order of 5V), while the source voltage generator VS is set to the ground reference potential (0V).

With the voltages as described above, hot electrons are produced in the channel 34 near the drain region 14. These hot electrons have sufficient energy to be accelerated across the gate dielectric 36 and trapped on the floating gate 32. The trapped hot electrons cause the threshold voltage of the field effect transistor (FET) that is formed by the flash EEPROM cell 10 to be increased by three to five volts. This change in threshold voltage by the trapped hot electrons causes the cell to be programmed.

During the programming process, some of the hot electrons are trapped 42 in the tunneling oxide 36 or in surface states 40 at the surface of the p-type substrate 12. These trapped electrons cause the threshold voltage of the erased flash EEPROM cell 10 to increase.

To perform a channel erase of the flash EEPROM cell 10 of the prior art, as shown in FIG. 2a, a moderately high positive voltage (on the order of 5V) is generated by the substrate voltage generator Vsub 20. Concurrently, the gate control voltage generator VG is set to a relatively large negative voltage (on the order of −10V). The drain voltage generator VD is usually disconnected from the terminal 24 to allow the drain region 14 to float. The source voltage generator VS is usually disconnected from the source region 16 to allow the source region 16 to float. Under these conditions there is a large electric field developed across the tunneling oxide 36 in the source region 16. This field causes the electrons trapped in the floating gate 32 to be extracted to the channel region 34 by the Fowler-Nordheim tunneling.

FIG. 1b describes an alternate structure of a non-volatile semiconductor memory device of the prior art having a floating gate 32. The memory device is constructed with a n-well 47 diffused into the semiconductor substrate 12 and a p-well 45 diffused into the n-well 47. The source region 16 and drain 14 are then diffused into the p-well 45 with a floating gate 32 and control gate 28 disposed on the surface of the semiconductor substrate much as described in FIG. 1a. The erasure process, as shown in FIG. 2a, involves applying a positive voltage (approximately +5.0V) to the p-well 45 forcing the control gate to a relatively large negative voltage (approximately −10V), and floating the drain 14 and source 16. Generally, the substrate is set to the ground reference potential while the n-well 47 is allowed to float.

U.S. Pat. No. 5,726,933 (Lee et al. 933) describes a method for erasing a flash EEPROM cell 10 as shown in FIG. 1b. The method for erasing of Lee et al. 933 is for eliminating cycling-induced electron trapping in the tunneling oxide 36 of the flash EEPROM cell. The method of Lee et al. 933, as shown in FIG. 2b, begins by setting the control gate voltage generator VG to apply a relatively large clipped sinusoidal negative pulse (approximately −10V) to the control gate 28. The source voltage generator VS is set to a apply a low positive voltage level (approximately 4.3V) to the source region 16. The drain region 14 is allowed to float and the p-well voltage generator Vpw is set to apply a ground reference potential to the p-well 45.

The relatively large clipped sinusoidal negative voltage has three phases. The first phase is an initial decreasing sinusoid that starts at the initial reference voltage (0V) and decreases according to a sine function to the maximum negative voltage (approximately −10V). The second phase is the clipped peak phase where the voltage remains at the maximum negative voltage (approximately −10V). The third phase is a final increasing sinusoid that starts at the maximum negative voltage and increases to the initial reference voltage. The first phase has a duration of from approximately 20 milliseconds to approximately 100 milliseconds. The second phase has a duration of from approximately 100 milliseconds to approximately 500 milliseconds. The third phase has a duration of from 20 milliseconds to approximately 100 milliseconds.

Referring back to FIG. 1b, during the erasure process, not all the hot electrons 42 trapped in the tunneling oxide 36 nor all the surface states 40 are removed. As can be seen in FIG. 3, after performing program/erase cycling, the programming threshold voltage 50 decreases 52 over time. The erase threshold voltage 55 remains relatively constant over the program/erase cycling.

SUMMARY OF THE INVENTION

An object of this invention is to provide a method for the erasure of data from a flash EEPROM.

Another object of this invention is to provide a method to eliminate electrical charges trapped in the tunneling oxide and within surface states at the interface of the semiconductor substrate.

Further another object of this invention is to eliminate electrical charges trapped in the tunneling oxide of a flash EEPROM to maintain proper separation of the programmed threshold voltage and the erased threshold voltage after extended programming and erasing cycles.

To accomplish these and other objects a method to channel erase a flash EEPROM cell consists of applying a relatively large clipped sinusoidal negative voltage pulse to the control gate of the EEPROM cell and concurrently applying a moderately large positive voltage pulse to a first diffusion region. At the same time, a ground reference potential is applied to the semiconductor substrate, while the drain and source, and a second diffusion region are allowed to float.

The source and drain are diffused into the first diffusion region, which in turn is diffused into the second diffusion region. The second diffusion region is diffused into the surface of the semiconductor substrate. The control gate is placed on an interpoly dielectric which overlays a floating gate. The floating gate is placed on a tunneling oxide aligned with a channel region between the source and drain.

BRIEF DESCRIPTION OF THE DRAWINGS

FIGS. 1a and 1b are cross-sectional views of flash EEPROM's of the prior art.

FIGS. 2a and 2b are timing diagrams of erase cycles of the flash EEPROM of the prior art.

FIG. 3 is a plot of the threshold voltages versus the number of programming and erasing cycles, using the erasing cycle of the prior art as shown in FIG. 2a.

DETAILED DESCRIPTION OF THE INVENTION

Figure 4:
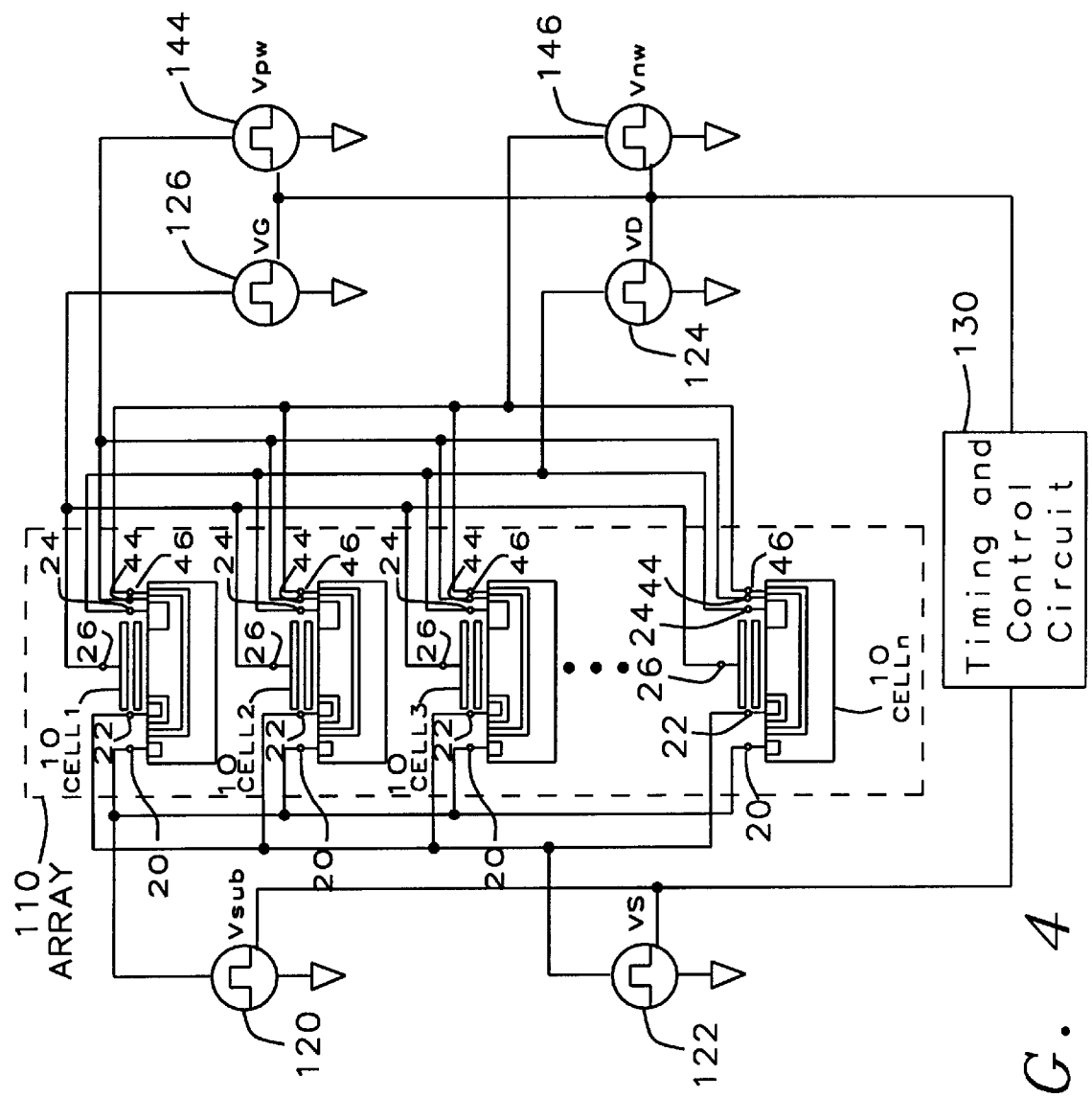
FIG. 4 is an array of flash EEPROM cells showing the connections of the voltage generators of this invention.

Referring now to FIG. 4, an array 110 of flash EEPROM cells 10 is disposed upon a common substrate. For convenience of design, the cells Cell1, Cell2, Cell3, . . . , Celln are formed into rows and column. The array has auxiliary circuitry (not shown) that addresses either the individual cells Cell1, Cell2, Cell3, . . . , Celln or groups of cells for reading from the cells or for writing or programming the cells. The writing or programming procedures are as described for the flash EEPROM cell of FIG. 1b.

The connection for the substrate voltage generator Vsub 120 is connected through the terminal 20 to the p-type substrate 12. The connection of the source voltage generator VS 122 to the source region is through the terminal 22. The connection of the drain voltage generator VD 124 to the drain region is through terminal 24. The connection of the gate control voltage generator VG 126 to the control gate is through the terminal 26. The p-well voltage generator Vpw 144 and the n-well voltage generator Vnw 146 are connected respectively to the p-well 45 and the n-well 47 through terminals 44 and 46. The timing and control circuitry 130 in conjunction with the auxiliary circuitry (not shown) determines the voltages and timings for the substrate voltage generator Vsub 120, the source voltage generator VS 122, the drain voltage generator VD 124, the gate control voltage generator VG 126 the p-well voltage generator Vpw 144, and the n-well voltage generator Vnw 146.

Figure 5:
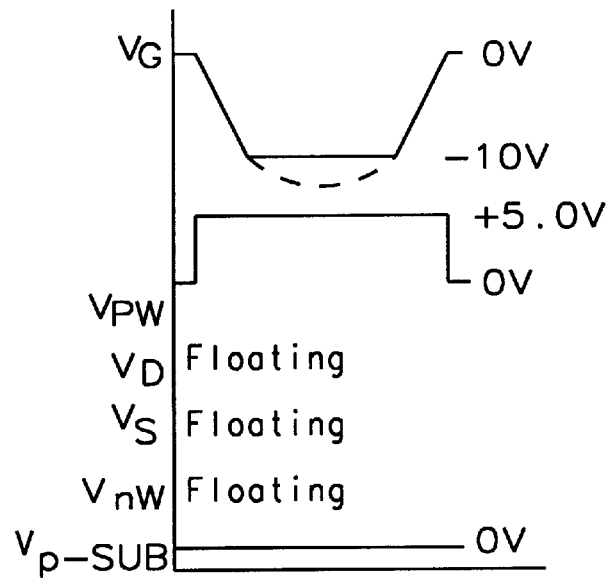
FIG. 5 is timing diagram of a channel erase cycle of a flash EEPROM of this invention.

Refer now to FIGS. 1b, 4, and 5 to understand the channel erase cycle of this invention. The channel erase starts by setting the gate control voltage generator VG 126 and thus the control gate to a relatively large clipped sinusoidal negative voltage (−10V). The relatively large clipped sinusoidal negative voltage has three phases. The first phase is an initial decreasing sinusoid that starts at the initial reference voltage (0V) and decreases according to a sine function to the maximum negative voltage (approximately −10V). The second phase is the clipped peak phase where the voltage remains at the maximum negative voltage. The third phase is a final increasing sinusoid that starts at the maximum negative voltage and increase to the initial reference voltage. The first phase has a range of duration of from approximately 20 milliseconds to approximately 100 milliseconds. The second phase has a range of duration of from approximately 100 milliseconds to approximately 500 milliseconds. The third phase has a range of duration of from approximately 20 milliseconds to approximately 100 milliseconds. The maximum negative voltage has a range of magnitude of from approximately −2.0 V to approximately −20.0 V.

The source voltage generator VS 122 is disconnected from the source region 16 to allow the source region 16 to be floating. The p-well voltage generator Vpw 144 and thus the p-well 45 is set to a moderately high voltage (5V). The range of the magnitude of the moderately high voltage is from approximately 2.0V to approximately 20.0V. The n-well voltage generator Vnw 146 is disconnected from the n-well 47 to allow the n-well 47 to be floating. The drain voltage generator VD 124 is disconnected from the drain region 14 to be floating. The substrate voltage generator Vsub 120 and thus the p-type substrate 12 is set to the ground reference potential (0V). The voltages as described and shown in FIG. 1b force the trapped charges 31 on the floating gate 32 of the flash EEPROM cell 10 is forced by the electric field 66 in the tunneling oxide 36 to flow through the tunneling oxide 36 by the Fowler-Nordheim tunneling into the source region 16.

The electric field 66 within the tunneling oxide 36 must be in the saturation region. The field is dependent upon the voltage of the gate control voltage generator VG, the p-well voltage generator Vpw and the number of trapped electrons 40 in the tunneling oxide 36 and in the surface states 42. Thus, the tunneling oxide field becomes:

$$\varepsilon_{tunneling\_oxide} = K_{GC}VG + \frac{Q_{trap}}{C_{ox}} + K_{pw-c}Vpw$$

Where:

$Q_{trap}$ is the charge of the electrons trapped in the floating gate 36.

$K_{GC}$ is the coupling ratio of the control gate 28.

$K_{pw-c}$ is the coupling ratio of the p-well 45.

The magnitude applied voltages of the gate control voltage generator VG, and the p-well voltage generator Vpw is dependent on the thickness of the tunneling oxide 36 and the interpoly dielectric 30, which varies with the technology parameters.

As can be seen from the above equation, the channel erase cycle of the prior art operates at high field due to the number of electrons available in the floating gate 32. Though the electrons 40 and 42 trapped in the tunneling oxide 36 can be detrapped during the channel erase cycle, a certain number of trapped centers are generated due to the high field and high current that passes through the tunneling oxide 36. However, the relatively large clipped sinusoidal negative voltage reduces the peak fields during the beginning of the erase cycle. This prevents the field-induced oxide trapping at the beginning of the erase cycle as in the prior art. Not having field-induced oxide trapping improves the endurance of the flash EEPROM cell.

Refer now to FIG. 1b for a description of the physical for the channel erase cycle of the flash EEPROM of this invention. As above described, during the channel erase phase, the gate control voltage generator VG is set to the second relatively large clipped sinusoidal negative voltage (−10V). Since the gate control voltage generator VG is connected through the terminal 26 to the control gate 28, the control gate 28 is set to the relatively large clipped sinusoidal negative voltage (−10V). The range of the magnitude of the relatively large clipped sinusoidal negative voltage is from approximately −2.0V to approximately −20.0V. The drain 14, source 16 and the n-well 47 are disconnected from their respective voltage generators and allowed to be floating. The voltage of the substrate voltage generator Vsub is set to the ground reference potential (0V), which is respectively connected through terminal 20 to the p-type substrate 12. The p-well voltage generator Vpw and thus the p-well 45 is set to the second moderately large voltage (5V).

The voltages as described set up an electric field 66 in the gate dielectric or tunneling oxide 36. Those electrons 42 trapped in the tunneling oxide 36 is forced to be dissipated in the p-type substrate 12 while there are no positive charges or "hot holes" generated, thus eliminating any residual charges from the floating gate 32 or trapped charges 42 from the tunneling oxide 36.

This process insures that the erased threshold voltage for the flash EEPROM cell 10 returns to the low threshold voltage of a completely erased cell. The elimination of the trapped charges 42 also allows the appropriate increase of the programmed threshold voltage to the high threshold voltage approximately (6V) of a programmed cell.

Figure 6:
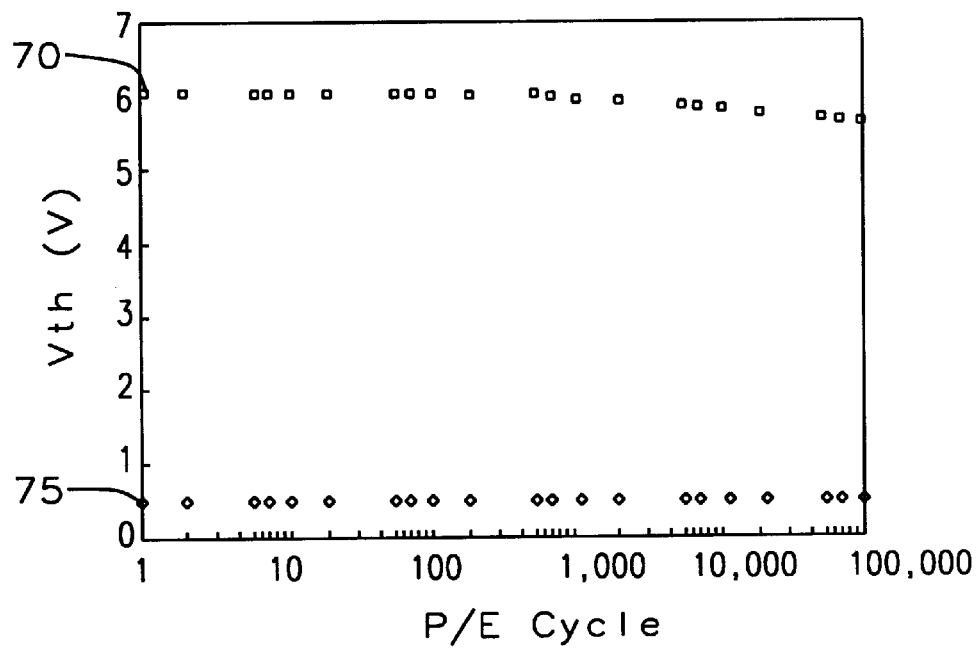
FIG. 6 is a plot of the threshold voltages versus the number of programming and erasing cycles using the erase cycle of this invention as shown in FIG. 5.

As is shown in FIG. 6, the programmed threshold voltage 70 remains at a relatively constant value of approximately 6V (changing by less than 0.5V) for at least 100,000 programming/erase cycles. Also, as can be seen, the erased threshold voltage 75 remains at a constant value of approximately 0.5V for the 100,000 programminglerase cycles. By not degrading the threshold as seen in FIG. 3a, the flash EEPROM cell 10 of FIG. 1b and the flash EEPROM array 110 of FIG. 4 maintain operation without failure for programming/erase cycle in excess of 100,000 cycles.

While this invention has been particularly shown and described with reference to the preferred embodiments thereof, it will be understood by those skilled in the art that various changes in form and details may be made without departing from the spirit and scope of the invention.

The invention claimed is:

1. A method to channel erase a flash EEPROM cell, which is comprised of a source and a drain diffused within a first region of a first conductivity type in the surface of a semiconductor substrate, and a control gate, a floating gate, and a tunneling oxide disposed upon the semiconductor substrate, to improve an endurance of the flash EEPROM cell after repeatedly programming and erasing said flash EEPROM cell, comprising the steps of:

applying a relatively large clipped sinusoidal negative voltage pulse to the control gate of said EEPROM cell;

concurrently applying a moderately large positive voltage pulse to said first region; and concurrently floating said drain and source.

2. The method of claim 1 wherein said first region is a first well of the first conductivity type diffused into a second well of a second conductivity type which is diffused into the semiconductor substrate, and said method further comprising:

concurrently applying a ground reference potential to said semiconductor substrate; and floating said second well.

3. The method to erase a flash EEPROM cell of claim 1 wherein channel erasing the flash EEPROM removes charges from the floating gate.

4. The method to erase a flash EEPROM cell of claim 1 wherein channel erasing to detrap the flash EEPROM removes charges trapped in the tunneling oxide between the floating gate and the semiconductor substrate.

5. The method to erase a flash EEPROM cell of claim 4 wherein detrapping the flash EEPROM allows a separation of a programmed threshold voltage from an erased threshold voltage to be maintained over the repeated writing and erasing of said flash EEPROM, thus improving said write/erase threshold voltage closure.

6. The method to erase a flash EEPROM cell of claim 1 wherein the moderately large positive voltage pulse has a range of magnitude of from approximately 2.0V to approximately 20.0V.

7. The method to erase a flash EEPROM cell of claim 1 wherein the moderately large positive voltage pulse has a voltage of approximately +5.0V.

8. The method to erase a flash EEPROM cell of claim 1 wherein the relatively large negative voltage pulse has a range of magnitude of from approximately −2.0V to approximately −20.0V.

9. The method to erase a flash EEPROM cell of claim 1 wherein the relatively large negative voltage pulse has a peak voltage of approximately −10V.

10. The method to erase a flash EEPROM cell of claim 1 wherein the moderately large positive voltage pulse and the relatively large clipped sinusoidal negative voltage pulse each have a duration of from approximately 10 milliseconds to two seconds.

11. The method to erase a flash EEPROM cell of claim 10 wherein the duration of the moderately large positive pulse and the relatively large clipped sinusoidal negative pulse prevents degradation to the tunneling oxide due to a lesser electric field in said tunneling oxide.

12. A non-volatile semiconductor memory device formed in the surface of a semiconductor substrate comprising:

a first diffusion region of a first conductivity type diffused into the surface of said semiconductor substrate;

a pair of diffusions of a second conductivity type spaced distally from one another to form a source region and a drain region within said first diffusion region;

a tunneling oxide insulation disposed upon said semiconductor substrate in a region generally between the source region and drain region in correspondence with a channel region and having a thickness which allows tunneling of carriers there through;

a floating gate electrode disposed upon said tunneling oxide insulation generally in correspondence with said channel region;

an inter-poly dielectric insulation disposed upon said floating gate electrode to insulate said floating gate;

a control gate electrode disposed upon said inter-poly dielectric insulation generally aligned with said floating gate; and a channel erasing means to remove electrical charges from said floating gate electrode and to detrap trapped electrical charges from said tunneling oxide insulation to improve a separation factor of a programmed threshold voltage and an erased threshold voltage of said non-volatile semiconductor memory device wherein charges are removed from the floating gate by the steps of:

coupling a first voltage source to the first diffusion region to apply a moderately large positive voltage pulse to the first diffusion region, simultaneously coupling a second voltage source to the control gate to apply a first relatively large clipped sinusoidal negative voltage to the control gate, simultaneously floating said drain and source.

13. The non-volatile semiconductor memory device of claim 12 further comprising:

a second diffusion region of a second conductivity type diffused into the surface of the semiconductor substrate into which said first diffusion region is diffused.

14. The non-volatile semiconductor memory device of claim 13 wherein the channel erasing means further performs the steps of:

coupling a ground reference potential to said semiconductor substrate; and floating said second diffusion region.

15. The non-volatile semiconductor memory device of claim 12 wherein the moderately large positive voltage pulse has a range of magnitude of from approximately 2.0V to approximately 20.0V.

16. The non-volatile semiconductor memory device of claim 12 wherein the moderately large voltage pulse has a voltage of approximately 5.0V.

17. The non-volatile semiconductor memory device of claim 12 wherein the relatively large clipped sinusoidal negative voltage pulse has a range of magnitude of from approximately −2.0V to approximately −20.0V.

18. The non-volatile semiconductor memory device of claim 12 wherein the relatively large clipped sinusoidal negative voltage pulse has a peak voltage of approximately −10V.

19. The non-volatile semiconductor memory device of claim 12 wherein the moderately large positive voltage pulse and the relatively large clipped sinusoidal negative voltage pulse each have a duration of from approximately 10 milliseconds to two seconds.

20. The non-volatile semiconductor memory device of claim 19 wherein the duration of the moderately large positive pulse and the relatively large clipped sinusoidal negative pulse prevents degradation to the tunneling oxide due to a lesser electric field in said tunneling oxide.

21. A non-volatile semiconductor memory device formed in a surface of a semiconductor substrate comprising:

a first diffusion region of a first conductivity type diffused into the surface of said semiconductor substrate;

a plurality of memory cells arranged in an array within said first diffusion wherein each cell comprises:

a pair of diffusions of a second conductivity type spaced distally from one another to form a source region and a drain region within said first diffusion region, a tunneling oxide insulation disposed upon said semiconductor substrate in a region generally between the source region and drain region in correspondence with a channel region and having a thickness which allows tunneling of carriers there through, a floating gate electrode disposed upon said tunneling oxide insulation generally in correspondence with said channel region, an inter-poly dielectric insulation disposed upon said floating gate electrode to insulate said floating gate, and a control gate electrode disposed upon said inter-poly dielectric insulation generally aligned with said floating gate; and a channel erasing means to remove electrical charges from said floating gate electrode and to detrap trapped electrical charges from said tunneling oxide insulation to improve a separation factor of a programmed threshold voltage and an erased threshold voltage of said non-volatile semiconductor memory device wherein charges are removed from the floating gate by the steps of:

coupling a first voltage source to the first diffusion well to apply a first moderately large positive voltage pulse to the first diffusion region, simultaneously coupling a second voltage source to the control gate to apply a relatively large clipped sinusoidal negative voltage to the control gate, and simultaneously floating said drain and source.

22. The non-volatile semiconductor memory device of claim 21 further comprising:

a second diffusion region of a second conductivity type diffused into the surface of the semiconductor substrate into which said first diffusion region is diffused.

23. The non-volatile semiconductor memory device of claim 22 wherein the channel erasing means further performs the steps of:

coupling a ground reference potential to said semiconductor substrate; and floating said second diffusion region.

24. The non-volatile semiconductor memory device of claim 21 wherein the moderately large positive voltage pulse has a range of magnitude of from approximately 2.0V to approximately 20.0V.

25. The non-volatile semiconductor memory device of claim 21 wherein the moderately high positive voltage pulse has a voltage of approximately 5.0V.

26. The non-volatile semiconductor memory device of claim 21 wherein the relatively high clipped sinusoidal negative voltage pulse has a range of magnitude of from approximately −2.0V to approximately −20.0V.

27. The non-volatile semiconductor memory device of claim 21 wherein the relatively high clipped sinusoidal negative voltage pulse has a peak voltage of approximately −10V.

28. The non-volatile semiconductor memory device of claim 21 wherein the moderately large positive voltage pulse and the relatively large clipped sinusoidal negative voltage pulse each have a duration of from approximately 10 milliseconds to two seconds.

29. The non-volatile semiconductor memory device of claim 28 wherein the duration of the moderately large positive pulse and the relatively large clipped sinusoidal negative pulse prevents degradation to the tunneling oxide due to a lesser electric field in said tunneling oxide.

30. An erasing circuit to remove charges and to detrap charges from flash EEPROM cells, including a source and a drain diffused within a first diffusion region of a first conductivity type diffused into a surface of a semiconductor substrate, and a control gate, a floating gate, and a tunneling oxide disposed upon the semiconductor substrate, comprising:

a first voltage source coupled to the control gate;

a second voltage source coupled to the source region;

a third voltage source coupled to the drain region;

a fourth voltage source coupled to the first diffusion region; and a channel erasing control means coupled to the first, second, third, and fourth voltage sources to control said first, second, third, and fourth voltage sources, wherein a channel erasing to remove charges from said floating gate is accomplished by:

forcing said first voltage source to apply a relatively large clipped sinusoidal negative voltage pulse to the control gate of said EEPROM cell, simultaneously disconnecting said second voltage source to float the source of said EEPROM cell, simultaneously disconnecting said third voltage source to float the drain of said EEPROM cell, simultaneously disconnecting said sixth voltage source to float the first well, and forcing said fourth voltage source to apply a moderately large positive voltage pulse to the first diffusion region.

31. The erasing circuit of claim 30 further comprising:

a fifth voltage source connected to the semiconductor substrate; and a sixth voltage source connected to a second diffusion region, whereby said second diffusion region is formed from a material of a second conductivity type diffused into said surface of the semiconductor substrate and into which said first diffusion region is placed.

32. The erasing circuit of claim 31 wherein said channel erasing control means is connected to said fifth and sixth voltage sources and forces said fifth voltage to place said semiconductor substrate at the ground reference potential and forces said sixth voltage source to be disconnected from said second diffusion region to float said second diffusion region.

33. The erasing means of claim 30 wherein channel erasing allows a separation of a programmed threshold voltage from an erased threshold voltage to be maintained over the repeated writing and erasing of said flash EEPROM, thus improving the endurance of said flash EEPROM.

34. The erasing means of claim 30 wherein the moderately large positive voltage pulse has a range of magnitude of from approximately 2.0V to approximately 20.0V.

35. The erasing means of claim 30 wherein the moderately high positive voltage pulse has a voltage of approximately 5.0V.

36. The erasing means of claim 30 wherein relatively large clipped sinusoidal negative voltage pulse has a range of magnitude of from approximately −2.0V to approximately 20.0V.

37. The erasing means of claim 30 wherein the relatively large clipped sinusoidal negative voltage pulse has a voltage of approximately −10V.

38. The erasing means of claim 30 wherein the moderately large positive voltage pulse and the relatively large clipped sinusoidal negative voltage pulse each have a duration of from approximately 10 milliseconds to two seconds.

39. The erasing means of claim 38 wherein the duration of the moderately large positive pulse and the relatively large clipped sinusoidal negative pulse prevents degradation to the tunneling oxide due to a lesser electric field in said tunneling oxide.

* * * * *